United States Patent
Kwon et al.

(10) Patent No.: US 7,994,643 B2
(45) Date of Patent: Aug. 9, 2011

(54) STACK PACKAGE, A METHOD OF MANUFACTURING THE STACK PACKAGE, AND A DIGITAL DEVICE HAVING THE STACK PACKAGE

(75) Inventors: Heung-Kyu Kwon, Seongnam-si (KR); Tae-Hun Kim, Cheonan-si (KR); Sang-Uk Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 427 days.

(21) Appl. No.: 12/078,694

(22) Filed: Apr. 4, 2008

(65) Prior Publication Data
US 2008/0246162 A1   Oct. 9, 2008

(30) Foreign Application Priority Data

Apr. 4, 2007 (KR) .................... 10-2007-0033329
Apr. 4, 2007 (KR) .................... 10-2007-0033397
Feb. 22, 2008 (KR) .................... 10-2008-0016402

(51) Int. Cl.
*H01L 23/48* (2006.01)
*H01L 23/52* (2006.01)
*H01L 29/40* (2006.01)
*H01L 23/02* (2006.01)
*H01L 27/15* (2006.01)
*H01L 33/00* (2010.01)

(52) U.S. Cl. ............ 257/777; 257/686; 257/81; 257/99; 257/100; 257/678

(58) Field of Classification Search .................. 257/686, 257/777, 81, 99, 100, 678
See application file for complete search history.

(56) References Cited

U.S. PATENT DOCUMENTS

| | | | | |
|---|---|---|---|---|
| 5,491,612 | A | * | 2/1996 | Nicewarner, Jr. ............. 361/760 |
| 5,742,477 | A | * | 4/1998 | Baba ............................ 361/704 |
| 5,798,282 | A | * | 8/1998 | Bertin et al. .................... 438/15 |
| 5,973,392 | A | | 10/1999 | Senba et al. |
| 6,222,212 | B1 | * | 4/2001 | Lee et al. ........................ 257/207 |
| 6,838,761 | B2 | | 1/2005 | Karnezos |
| 2001/0020741 | A1 | * | 9/2001 | Masayuki et al. ............ 257/685 |
| 2004/0222508 | A1 | | 11/2004 | Aoyagi |
| 2005/0040509 | A1 | | 2/2005 | Kikuchi et al. |
| 2008/0142928 | A1 | * | 6/2008 | Sitaram et al. ................ 257/621 |
| 2008/0179734 | A1 | * | 7/2008 | Kwon et al. ................... 257/691 |

FOREIGN PATENT DOCUMENTS

KR  1020020013128  2/2002
KR  1020050079572  8/2005

* cited by examiner

*Primary Examiner* — Leonardo Andújar
*Assistant Examiner* — Teresa M. Arroyo
(74) *Attorney, Agent, or Firm* — Harness, Dickey & Pierce, P.L.C.

(57) ABSTRACT

A chip stack package may include a substrate, semiconductor chips, a molding member and a controller. The substrate may have a wiring pattern. The semiconductor chips may be stacked on a first surface of the substrate. Further, the semiconductor chips may be electrically connected to the wiring pattern. The molding member may be formed on the first substrate covering the semiconductor chips. The controller may be arranged on a second surface of the substrate. The controller may be electrically connected to the wiring pattern. The controller may have a selection function for selecting operable semiconductor chip(s) among the semiconductor chips.

21 Claims, 11 Drawing Sheets

STACK PACKAGE, A METHOD OF
MANUFACTURING THE STACK PACKAGE,
AND A DIGITAL DEVICE HAVING THE
STACK PACKAGE

PRIORITY STATEMENT

This non-provisional patent application claims priority under 35 U.S.C. §119 to Korean Patent Application Nos. 2007-33329, filed on Apr. 4, 2007, 2007-33397, filed on Apr. 4, 2007, and 2008-16402, filed on Feb. 22, 2008 in the Korean Intellectual Property Office (KIPO), the entire contents of which are herein incorporated by reference.

BACKGROUND

Description of the Related Art

Generally, a semiconductor package may be manufactured by a fabrication process for forming semiconductor chips, which include electrical circuits on a semiconductor substrate, such as a silicon wafer, an electrical die sorting (EDS) process for testing electrical characteristics of the semiconductor chips, and a packaging process for encapsulating the semiconductor chips and singulating the encapsulated semiconductor chips.

As memory capacities are increasing and memory requirements for multimedia and the use of digital devices are increasing, market requirements for higher memory capacity are also increasing. Therefore, packaging processes have been developed to achieve higher density semiconductor chips. An example of a semiconductor package for achieving high density semiconductor chips may include a chip stack package where a plurality of semiconductor chips is sequentially stacked.

However, a conventional chip stack package may have lower test efficiency in a test process performed after assembling the chip stack package. That is, the conventional chip stack package, including the sequentially stacked semiconductor chips, may have a test efficiency relatively lower than that of a semiconductor package including a single semiconductor chip. Further, the chip stack package may be considered to be defective when a defect occurs in one semiconductor chip, rather than if all of the semiconductor chips are defective. When the chip stack package, including the defective semiconductor chip is determined to be defective, only the defective semiconductor chip may be separated from the chip stack package. However, because the semiconductor chips in the conventional chip stack package may be molded with a molding member, such as an epoxy molding compound (EMC), the defective semiconductor chip may not be removed without breaking the molding member and damaging the chip stack package. As a result, the normal semiconductor chips may also be discarded together with the defective semiconductor chip.

SUMMARY

Example embodiments may provide a stack package that may be capable of selectively using operable semiconductor chips of stacked semiconductor chips when one of the stacked semiconductor chips is defective.

Example embodiments may also provide methods of manufacturing stack packages.

Example embodiments may further provide a digital device having a stack package.

In at least one example embodiment, a chip stack package may include a substrate having a wiring pattern, semiconductor chips, a molding member and a controller. The semiconductor chips may be stacked on the substrate and may be electrically connected to the wiring pattern. In an example embodiment, the semiconductor chips may be stacked on a first surface of the substrate. The molding member may be formed on the substrate covering the semiconductor chips. The controller may be arranged the substrate and may be electrically connected to the wiring pattern. In an example embodiment, the controller may be arranged on a second surface of the substrate. Further, the controller may have a selection function for selecting operable semiconductor chips among the semiconductor chips.

According to an example embodiment, the chip stack package may further include a display member formed on the lower surface of the substrate and/or an upper surface of the molding member to display the operable semiconductor chips.

According to an example embodiment, the semiconductor chips and the wiring pattern may be connected to each other through a bonding wire, a plug, or the like. Further, the controller and the wiring pattern may be connected to each other through a conductive bump.

According an example embodiment, the controller may include a logic chip for controlling the operation of the semiconductor chips.

According to an example embodiment, the controller may also include a selection chip having the selection function. The selection chip may be detachably inserted into a receiving groove of the controller. The selection chip may include read-only memory (ROM), static random access memory (SRAM), etc.

According to an example embodiment, the chip stack package may further include external terminals formed on the lower surface of the substrate.

In at least one example embodiment, a method of manufacturing a chip stack package may include, stacking a plurality of semiconductor chips on a substrate having a wiring pattern and electrically connecting the semiconductor chips to the wiring pattern. Stacking of the semiconductor chips may include stacking the semiconductor chips on an upper surface of the substrate. The method may further include forming a molding member on the substrate covering the semiconductor chips. The semiconductor chips may be tested to determine whether the semiconductor chips are operable. The method may also include arranging a controller on the substrate and electrically connecting the controller to the wiring pattern. In an example embodiment, the controller may be arranged on a lower surface of the substrate. The controller may have a logic chip for controlling the operation of the operable semiconductor chips, and a selection chip for selecting the operable semiconductor chips among the semiconductor chips based on the test results.

According to an example embodiment, the method may further include displaying the operable semiconductor chips on at least one of the lower surface of the substrate and/or an upper surface of the molding member.

According to an example embodiment, arranging the controller on the second surface may include integrally forming the logic chip and the selection chip, into which a program for selecting the operable semiconductor chips is loaded, in the controller. Arranging the controller may also include forming a receiving groove for detachably receiving the selection chip in the controller, and inserting the selection chip having a program for selecting the operable semiconductor chips into the receiving groove to be connected to the wiring pattern.

According to an example embodiment, the semiconductor chips and the wiring pattern may be connected to each other through a bonding wire, a plug. Further, the controller and the wiring pattern may be connected to each other through a conductive bump.

According to an example embodiment, the method may further include arranging external terminals on the lower surface of the substrate.

In at least one example embodiment, a chip stack package may include a substrate having a wiring pattern, semiconductor chips, a molding member, a logic chip and a selection chip. The semiconductor chips may be stacked on an upper surface of the substrate and electrically connected to the wiring pattern. The molding member may be formed on the upper surface of the substrate covering the semiconductor chips. The logic chip may be arranged on a lower surface of the substrate and electrically connected to the wiring pattern to control the operation of the semiconductor chips. The selection chip may be independently arranged on the lower surface of the substrate and electrically connected to the wiring pattern to select operable semiconductor chips among the semiconductor chips.

According to an example embodiment, the chip stack package may further include a display member formed on the lower surface of the substrate and/or an upper surface of the molding member to display the operable semiconductor chips.

According to an example embodiment, the chip stack package may further include external terminals arranged on the lower surface of the substrate.

In at least one example embodiment, a method of manufacturing a chip stack package may include stacking a plurality of semiconductor chips on an upper surface of a substrate having a wiring pattern and electrically connecting the semiconductor chips to the wiring pattern. The method may also include forming a molding member on the upper surface of the substrate covering the semiconductor chips. In the method, a logic chip for controlling the operation of the semiconductor chips may be arranged on a lower surface of the substrate and the semiconductor chips may be tested to determine whether the semiconductor chips are operable. The method may further include arranging a selection chip on a lower surface of the substrate and electrically connecting the selection chip to the wiring pattern to select operable semiconductor chips among the semiconductor chips based on the test results.

According to an example embodiment, the method may further include displaying the operable semiconductor chips on the lower surface of the substrate and/or an upper surface of the molding member.

In at least one example embodiment, a multi-stack package may include a printed circuit board (PCB), a first package, a second package and a molding member. The second package may be arranged over the PCB and have a plurality of semiconductor chips electrically connected to the PCB. The first package may be interposed between the PCB and the second package and have a selection function for selecting operable semiconductor chips among the semiconductor chips. The molding member may be formed on the upper surface of the PCB to covering the first package and the second package.

According to an example embodiment, the multi-stack package may further include a display member formed on at least one of the lower surface and the upper surface of the second package to display the operable semiconductor chips.

According to an example embodiment, the first package may also include at least one of a ball grid array (BGA) package, a land grid array (LGA) package, a thin small-outline package (TSOP), a quad flat package (QFP), or the like.

According to still another example embodiment, the second package may include at least one of a BGA package, a TSOP package, or the like.

In at least one example embodiment, a digital device may include a body and a stack package, the stack package being built into the body. The stack package may include a substrate having a wiring pattern, semiconductor chips, a molding member and a controller. The semiconductor chips may be stacked on an upper surface of the substrate and be electrically connected to the wiring pattern. The molding member may be formed on the upper surface of the substrate covering the semiconductor chips. The controller may be arranged on a lower surface of the substrate and be electrically connected to the wiring pattern. Further, the controller may have a selection function for selecting operable semiconductor chips among the semiconductor chips.

According to example embodiments, operable semiconductor chips among semiconductor chips excluding a defective semiconductor chip may be selected using a selection chip thereby improving the productivity of a stack package.

BRIEF DESCRIPTION OF THE DRAWINGS

The above and other features of example embodiments will become readily apparent by reference to the following detailed description when considered in conjunction with the accompanying drawings, wherein.

DETAILED DESCRIPTION OF EXAMPLE EMBODIMENTS

Figure 1:
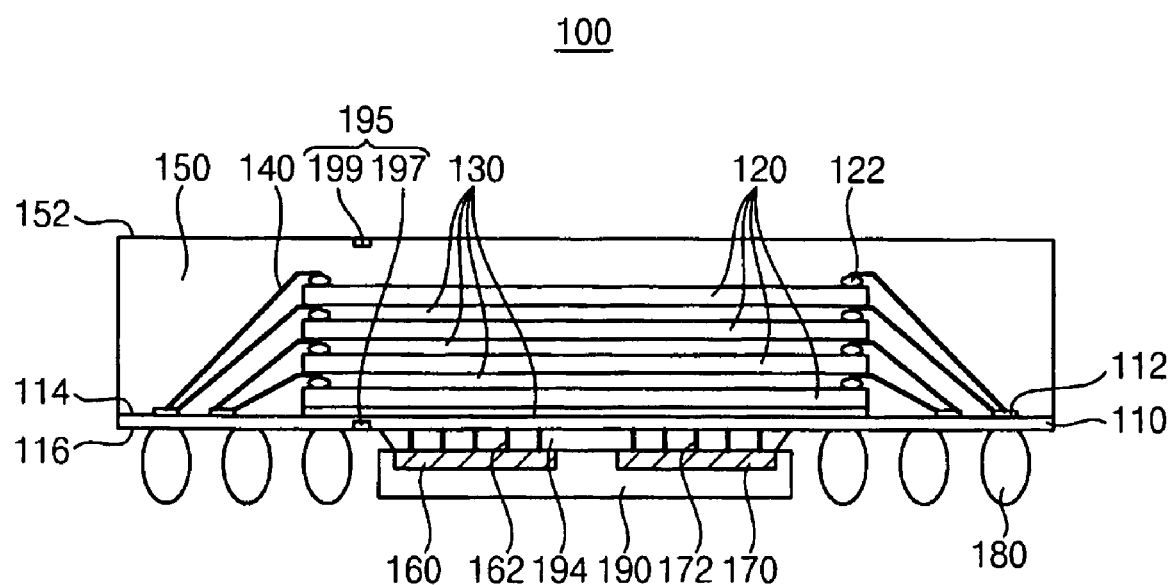
FIG. 1 is a cross-sectional view illustrating a chip stack package in accordance with an example embodiment.

Various example embodiments will now be described with reference to the accompanying drawings, in which some example embodiments are shown. Example embodiments may, however, be embodied in many different forms and should not be construed as limited to example embodiments set forth herein. Rather, these example embodiments are provided so that this disclosure will be thorough and complete. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a chip stack package in accordance with an example embodiment.

Referring to FIG. 1, a chip stack package 100 may include a substrate 110, a plurality of semiconductor chips 120, a plurality of adhesive layers 130, conductive wires 140, a molding member 150, a controller 190, a display member 195 and/or a plurality of external terminals 180.

The substrate 110 may have a flat plate shape. A wiring pattern 112 may be provided on the substrate 110. In example embodiments, the wiring pattern 112 may be formed on an upper surface 114 of the substrate 110. The wiring pattern 112 may also be formed on the upper surface 114 and a lower surface 116 of the substrate 110. Examples of the substrate 110 may include a printed circuit board (PCB), a tape wiring substrate, and a ceramic substrate.

The semiconductor chips 120 may be stacked on the upper surface 114 of the substrate 110. First electrode pads 122 may be arranged on upper surface of each of the semiconductor chips 120. In example embodiments, the first electrode pads 122 may be arranged on an edge portion of the upper surface of the semiconductor chips 120.

The adhesive layers 130 may be interposed between the upper surface 114 of the substrate 110 and the lowermost semiconductor chip 120 and/or between the semiconductor chips 120. The adhesive layers 130 may have openings for exposing the first electrode pads 122. Further, the adhesive layers 130 may include an insulation material. Examples of the adhesive layers 130 may include epoxy, adhesive agent, or tape.

The conductive wires 140 may electrically connect the first electrode pads 122 of the semiconductor chips 120 to the wiring pattern 112 of the substrate 110. Examples of the conductive wires 140 may include gold wires or aluminum wires.

The molding member 150 may be formed on the upper surface 114 of the substrate 100 to cover the semiconductor chips 120 and the conductive wires 140. The molding member 150 may protect the semiconductor chips 120 and the conductive wires 140 from the external environment, including external shock. Examples of the molding member 150 may include glop-top or an epoxy molding compound (EMC).

The controller 190 may be arranged on the lower surface 116 of the substrate 110. In example embodiments, the controller 190 may include a logic chip 160 and a selection chip 170.

As shown in example embodiments of FIG. 1, the logic chip 160 may be arranged on a left lower surface 116 of the substrate 110 to control the operation of the semiconductor chips 120. Examples of the logic chip 160 may include a central processing unit (CPU) or an application-specific integrated circuit (ASIC). The logic chip 160 may have second electrode pads (not shown) formed on an upper surface of the logic chip 160. In example embodiments, the second electrode pads may be arranged crossing the upper surface of the logic chip 160.

First conductive bumps 162 may electrically connect the second electrode pads of the logic chip 160 to the wiring pattern 112 of the substrate 110. When the wiring pattern 112 is formed only on the upper surface 114 of the substrate 110, the first conductive bumps 162 may be formed through the substrate 110 to be electrically connected to the wiring pattern 112.

As shown in example embodiments in FIG. 1, the selection chip 170 may be arranged on a right lower surface 116 of the substrate 110. Examples of the selection chip 170 may include read-only memory (ROM) or static random access memory (SRAM). A program for selecting operable semiconductor chips 120 among the semiconductor chips 120, which are determined by a process for testing the semiconductor chips 120, may be loaded into the selection chip 170. Thus, the selection chip 170 may select the operable semiconductor chips 120. The selection chip 170 may have third electrode pads (not shown) formed on an upper surface of the selection chip 170. In example embodiments, the third electrode pads may be arranged crossing the upper surface of the selection chip 170.

In example embodiments, the logic chip 160 and the selection chip 170 may be integrally formed with the controller 190. That is, the logic chip 160 and the selection chip 170 need not be separated from the controller 190.

Second conductive bumps 172 may electrically connect the third electrode pads of the selection chip 170 to the wiring pattern 112 of the substrate 110. When the wiring pattern 112 is formed only on the upper surface 114 of the substrate 110, the second conductive bumps 172 may be formed through the substrate 110 to be electrically connected to the wiring pattern 112.

The display member 195 may display the operable semiconductor chips 120. For example, the display member 195 may display positions of the defective semiconductor chips, positions of the operable semiconductor chips, the total memory capacity of the operable semiconductor chips, etc. A process for manufacturing the chip stack package 100 may be performed such that the lower surface 116 of the substrate 110 is upwardly oriented. Thus, the display member 195 may include a first display portion 197 arranged on the lower surface 116 of the substrate 110 so that workers and/or equipment may readily identify the operable semiconductor chips 120. Further, for the workers and/or equipment to readily identify the operable semiconductor chips 120, regardless of orientations of the chip stack package 100, the display member 195 may include a second display portion 199 arranged on an upper surface 152 of the molding member 150. Therefore, the workers and/or equipment may identify numbers, positions, etc., of the operable semiconductor chips 120 displayed on the display member 195, so that the chip stack package 100 may be provided with the controller 190 having the selection chip 170 in which the program for selecting the operable semiconductor chips 120 is loaded. In example embodiments, the display member 195 may include a mark formed using a laser.

An underfill layer 194 may be interposed between the controller 190 and the substrate 110. In example embodiments, the underfill layer 194 may include an insulation material. Examples of the insulation material may include an epoxy, a thermoplastic material, a thermoset material, a polyimide, a polyurethane, or a polymeric material.

The external terminals 180 may be arranged on the lower surface 116 of the substrate 110, excluding a region where the controller 190 is placed. The external terminals 180 may be electrically connected to the wiring pattern 112 of the substrate 110. When the wiring pattern 112 is formed only on the upper surface 114 of the substrate 110, the external terminals 180 may be formed through the substrate 110 to be electrically connected to the wiring pattern 112. In example embodiments, an example of the external terminals 180 may include solder balls.

According to example embodiments, the selection chip 170 may select the operable, non-defective, semiconductor chips among the semiconductor chips 120. Thus, the chip stack package may be used even though a defective semiconductor chip(s) may exist in the chip stack package 100.

Figure 2A:
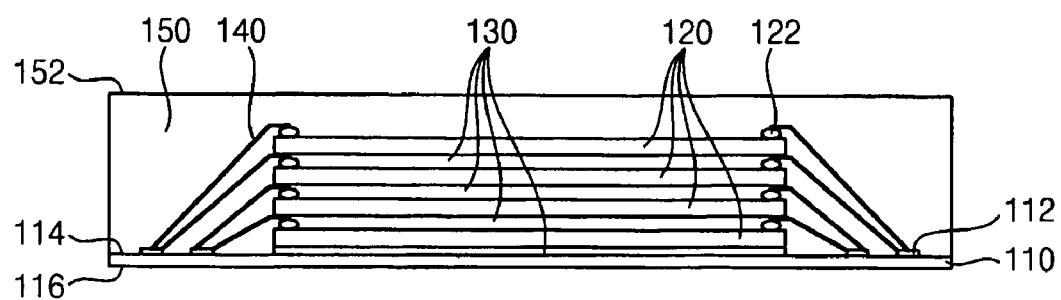
FIGS. 2A to 2C are cross-sectional views illustrating an example embodiment of a method of manufacturing the chip stack package in FIG. 1.
Figure 2B:
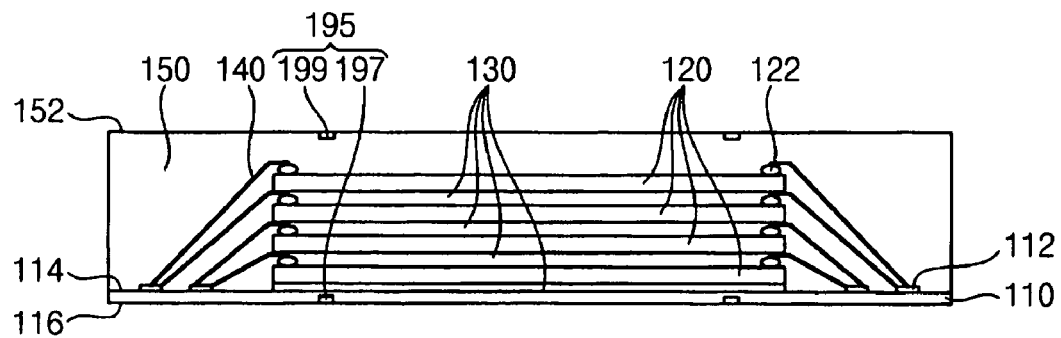
Figure 2C:
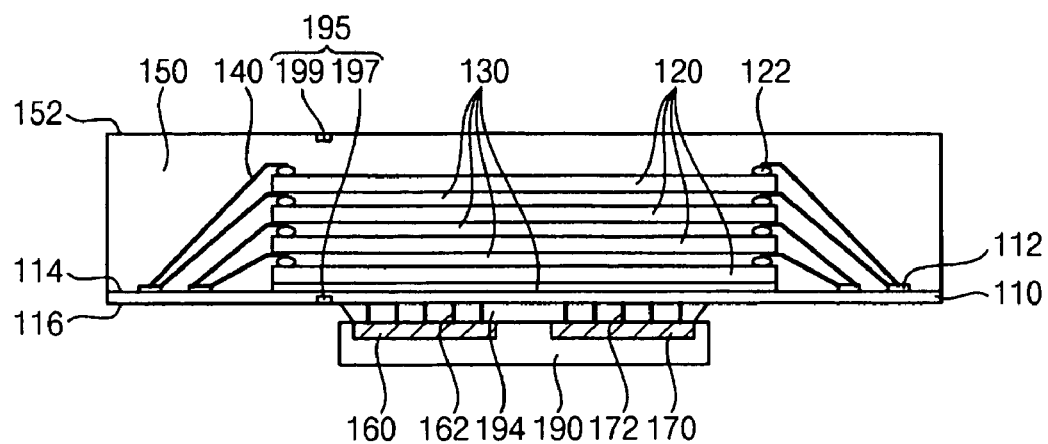

FIGS. 2A to 2C are cross-sectional views illustrating an example embodiment of a method of manufacturing the chip stack package in FIG. 1.

Referring to FIG. 2A, the substrate 110 having the wiring pattern 112 is prepared. The semiconductor chips 120 may be sequentially attached to the upper surface 114 of the substrate 110 using the adhesive layers 130, such as an epoxy, an adhesive, or a tape. The first electrode pads 122 may be arranged on the edge portion of the upper surface of the semiconductor chips 120. Further, the adhesive layers 130 may not cover the first electrode pads 122.

The first electrode pads 122 of the semiconductor chips 120 may be electrically connected to the wiring pattern 112 of the substrate 110 using the conductive wires 140, for example. In example embodiments, the conductive wires 140 may include gold wires or aluminum wires.

A mold (not shown) for forming the molding member 150 may be prepared. The mold may be placed on the upper surface 114 of the substrate 110 to define an inner space between the mold and the upper surface 114 of the substrate 110. An insulation material may then be poured into the inner space. In example embodiments, examples of the insulation material may include glop-top or an EMC. The insulation material may cover the upper surface 114 of the substrate 110, the semiconductor chips 120 and the conductive wires 140. The insulation material may then be hardened to form the molding member 150. The mold is removed from the molding member 150.

Referring to FIG. 2B, the semiconductor chips 120 may be tested using a tester (not shown) to determine whether the semiconductor chips 120 are operable (not defective). The test results may be displayed on the display member 195. In example embodiments, the display results may include positions of the defective semiconductor chips, positions of the operable semiconductor chips, the total memory capacity of the operable semiconductor chips, etc. Further, the test results may be displayed on the lower surface 116 of the substrate 110 or the upper surface 152 of the molding member 150. The test results also may be displayed on the lower surface 116 of the substrate 110 and the upper surface 152 of the molding member 150. Thus, after completing the chip stack package 100, the memory capacity of the chip stack package 100 may be easily identified using the displayed test results.

Referring to FIG. 2C, the first conductive bumps 162 and the second conductive bumps 172 may be arranged on the second electrode pads and the third electrode pads of the controller 190, respectively. In example embodiments, the controller 190 may include the logic chip 160 and the selection chip 170. Further, the logic chip 160 and the selection chip 170 may be integrally formed with the controller 190. Examples of the logic chip 160 may include a CPU or an ASIC. A program corresponding to the test results may be input to the selection chip 170. Thus, the selection chip 170 may select the operable semiconductor chips 120. Examples of the selection chip 170 may include ROM or SRAM.

An insulation material may be coated on the lower surface 116 of the substrate 110 to form the underfill layer 194. Examples of the insulation material may include an epoxy, a thermoplastic material, a thermoset material, a polyimide, a polyurethane, or a polymeric material.

The controller 190 may be located under the lower surface 116 of the substrate 110 having the underfill layer 194. The substrate 110 and the controller 190 may be compressed with the first conductive bumps 162 and the second conductive bumps 172 being heated. The first conductive bumps 162 and the second conductive bumps 172 may penetrate through the underfill layer 194 to be electrically connected to the wiring pattern 112 of the substrate 110. Thus, the logic chip 160 and the selection chip 170 may be electrically connected to the wiring pattern 112 of the substrate 110. When the wiring pattern 112 is formed only on the upper surface 114 of the substrate 110, the first conductive bumps 162 and the second conductive bumps 172 may penetrate through the substrate 110 to be electrically connected to plugs (not shown) that are connected to the wiring pattern 112. That is, the controller 190 may be connected to the substrate 110 by a flip-chip process.

The external terminals 180 may be mounted on the lower surface 116 of the substrate 110 to complete the chip stack package 100. The external terminals 180 may be arranged in a region of the lower surface 116 of the substrate 110 where the controller 190 is not placed. The external terminals 180 may be electrically connected to the wiring pattern 112 of the substrate 110. When the wiring pattern 112 is formed only on the upper surface 114 of the substrate 110, the external terminals 180 may be connected to the plugs. The external terminals 180 may also be provided to the substrate 110 before forming the controller 190.

Figure 3:
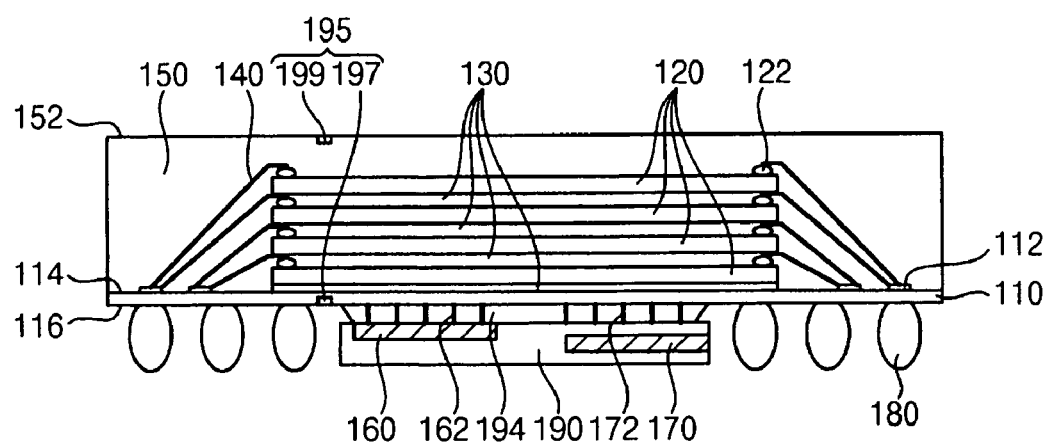
FIG. 3 is a cross-sectional view illustrating a chip stack package in accordance with an example embodiment.

FIG. 3 is a cross-sectional view illustrating a chip stack package in accordance with an example embodiment.

A chip stack package 100a of example embodiments may include elements substantially the same as those of the chip stack package 100. Thus, the same reference numerals refer to the same elements and any further illustrations with respect to the same elements are omitted herein for brevity.

Referring to FIG. 3, only the logic chip 160 may be integrally formed with the controller 190. In contrast, the controller 190 may have a receiving groove 192 for selectively receiving the selection chip 170. In example embodiments, for the workers and/or equipment to readily insert/withdraw the selection chip 170 to/from the receiving groove 172, the receiving groove 192 may be formed at a side surface of the controller 190.

Thus, it may not be necessary to select the controller 190 having the selection chip 170 in which the program corresponding to the test results is inputted. That is, only the selection chip 170 having the program corresponding to the test results may be selected and the selected selection chip 170 may be inserted into the receiving groove 192.

Figure 4A:
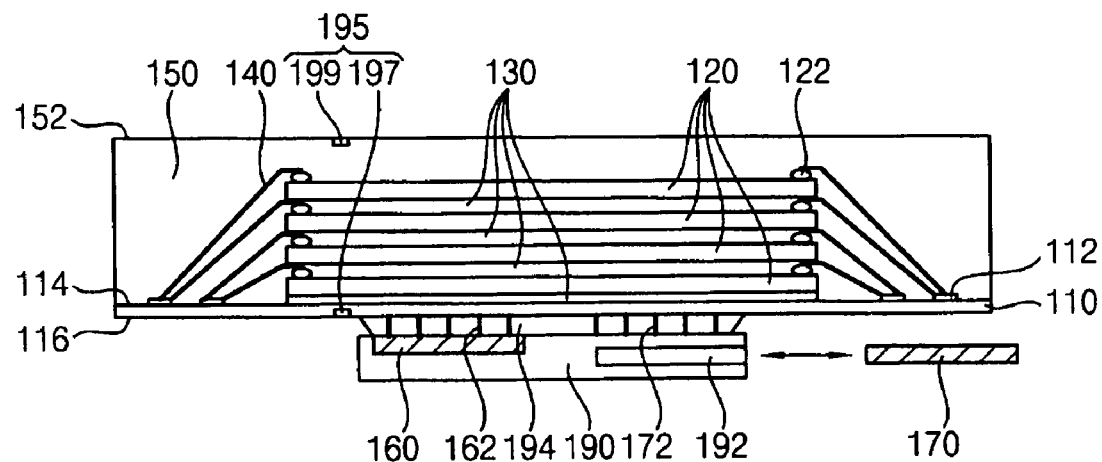
FIGS. 4A and 4B are cross-sectional views illustrating an example embodiment of a method of manufacturing the chip stack package in FIG. 3.
Figure 4B:
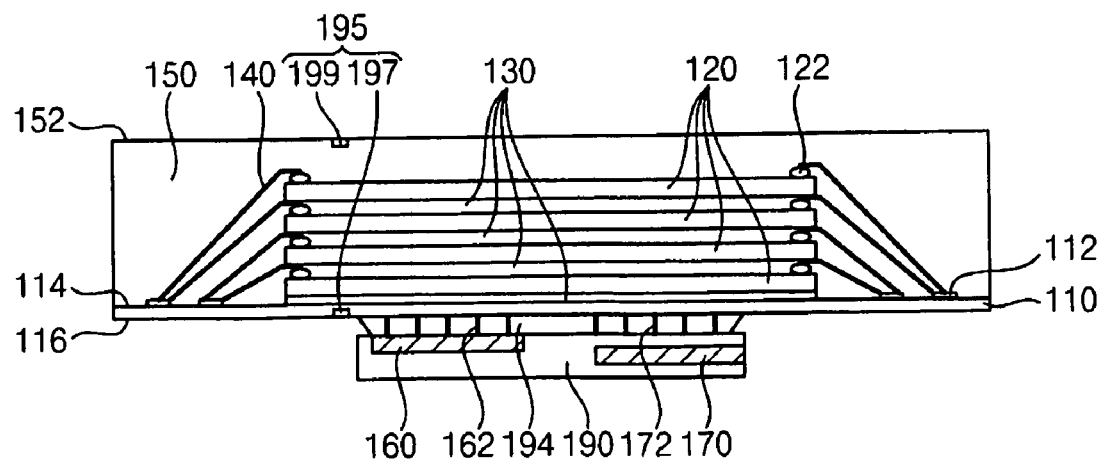

FIGS. 4A and 4B are cross-sectional views illustrating an example embodiment of a method of manufacturing the chip stack package in FIG. 3.

Processes substantially the same as those illustrated with reference to FIGS. 2A and 2B are performed to display the test results on the display member 195.

Referring to FIG. 4A, the controller 190 may be attached to the lower surface 116 of the substrate 110 and the controller 190 may have the receiving groove 192.

Referring to FIG. 4B, the selection chip 170 having the program that corresponds to the test results may be inserted into the receiving groove 192.

The external terminals 180 may be mounted to the lower surface 116 of the substrate 110 to complete the chip stack package 100a in FIG. 3.

According to example embodiments, the selection chip may be inserted into the controller, without the controller having to make a selection, in accordance with the test results with respect to the semiconductor chips.

Figure 5:
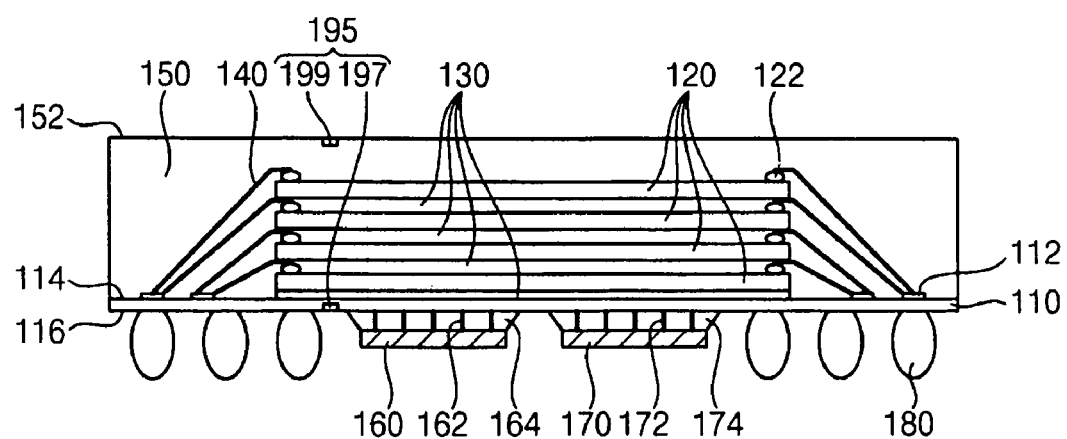
FIG. 5 is a cross-sectional view illustrating a chip stack package in accordance with an example embodiment.

FIG. 5 is a cross-sectional view illustrating a chip stack package in accordance with an example embodiment.

A chip stack package 100b of example embodiments may include elements substantially the same as those of the chip stack package 100 described above. Thus, the same reference numerals refer to the same elements and any further illustrations with respect to the same elements are omitted herein for brevity.

Referring to FIG. 5, the logic chip 160 and the selection chip 170 may not be built into the controller. In contrast, the logic chip 160 and the selection chip 170 may be independently arranged on the chip stack package 100b. As shown in example embodiments in FIG. 5, the logic chip 160 may be arranged on the left lower surface 116 of the substrate 110 and the selection chip 170 may be arranged on the right lower surface 116 of the substrate 110.

The first conductive bumps 162 may electrically connect the second electrode pads of the logic chip 160 to the wiring pattern 112 of the substrate 110. A first underfill layer 164 may be interposed between the logic chip 160 and the substrate 110.

The second conductive bumps 172 may electrically connect the third electrode pads of the selection chip 170 to the wiring pattern 112 of the substrate 110. A second underfill layer 174 may be interposed between the selection chip 170 and the substrate 110. The second underfill layer 174 may include a material substantially the same as that of the first underfill layer 164.

Figure 6A:
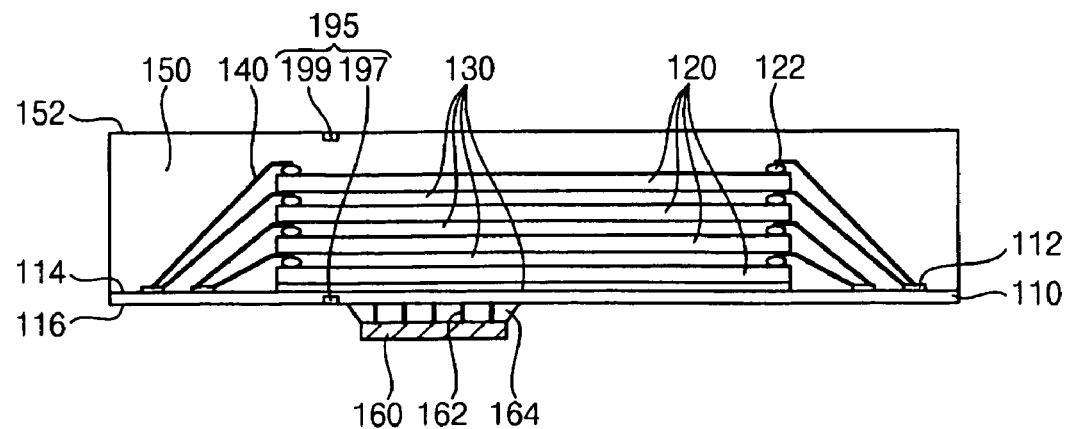
FIGS. 6A and 6B are cross-sectional views illustrating an example embodiment of a method of manufacturing the chip stack package in FIG. 5.
Figure 6B:
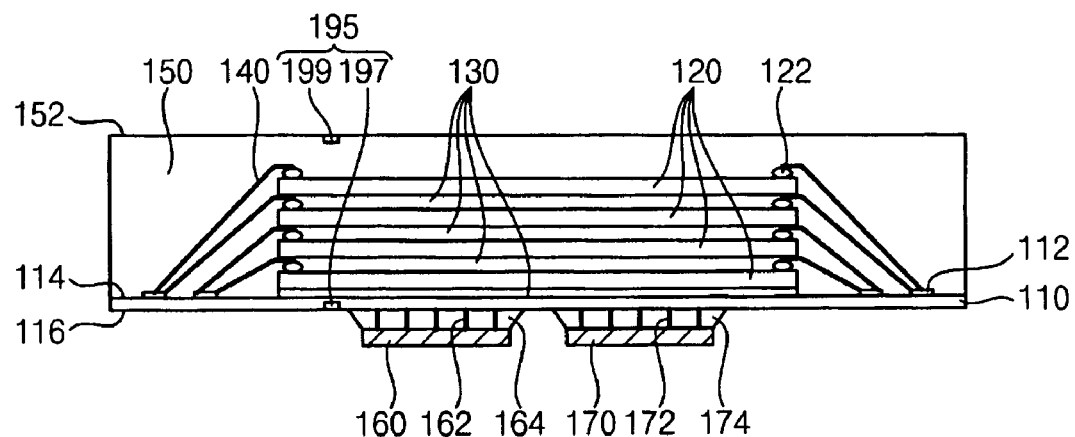

FIGS. 6A and 6B are cross-sectional views illustrating an example embodiment of a method of manufacturing the chip stack package in FIG. 5.

Processes substantially the same as those illustrated with reference to FIGS. 2A and 2B may be performed to display the test results on the display member 195.

Referring to FIG. 6A, the logic chip 160 may be attached to the left lower surface 116 of the substrate 110. The first underfill layer 164 may be formed lo between the logic chip 160 and the lower surface 116 of the substrate 110. The logic chip 160 may also be attached to the first underfill layer 164 after forming the first underfill layer 164 on the lower surface 116 of the substrate 110.

Referring to FIG. 6B, the selection chip 170 having the program that corresponds to the test results may be attached to the right lower surface 116 of the substrate 110. The second underfill layer 174 may be formed between the selection chip 170 and the lower surface 116 of the substrate 110. The selection chip 170 may also be attached to the second underfill layer 174 after forming the second underfill layer 174 on the lower surface 116 of the substrate 110.

The external terminals 180 may be mounted to the lower surface 116 of the substrate 110 to complete the chip stack package 100b in FIG. 5. According to example embodiments, the selection chip may be inserted into the controller, without the controller having to make a selection, in accordance with the test results with respect to the semiconductor chips.

Figure 7:
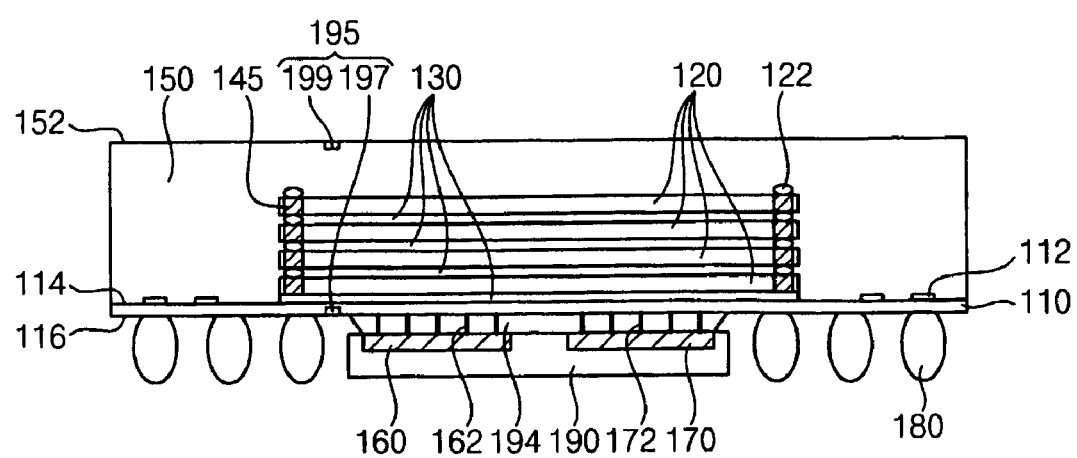
FIG. 7 is a cross-sectional view illustrating a chip stack package in accordance with an example embodiment.

FIG. 7 is a cross-sectional view illustrating a chip stack package in accordance with an example embodiment.

A chip stack package 100c of example embodiments may include elements substantially the same as those of the chip stack package 100 described above. Thus, the same reference numerals refer to the same elements and any further illustrations with respect to the same elements are omitted herein for brevity.

Referring to FIG. 7, the first electrode pads 122 of the semiconductor chips 120 may be electrically connected to the wiring pattern 112 of the substrate 110 through plugs 145. In example embodiments, holes may be vertically formed through the semiconductor chips 120. The holes may be filled with the plugs 145 to electrically connect the first electrode pads 122 of the stacked semiconductor chips 120 to the wiring pattern 112 of the substrate 110.

A method of manufacturing the chip stack package 100c may be substantially the same as described above, except for including a process for forming the plugs 145. Thus, any further illustrations with respect to the method are omitted herein for brevity.

Figure 8:
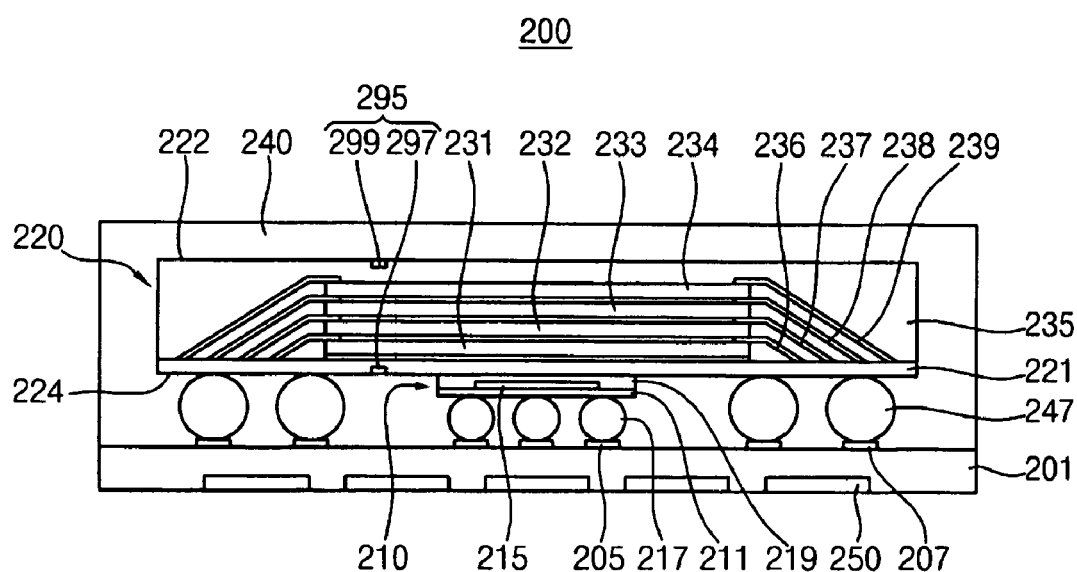
FIG. 8 is a cross-sectional view illustrating a multi-stack package in accordance with an example embodiment.

FIG. 8 is a cross-sectional view illustrating a multi-stack package in accordance with an example embodiment.

Referring to FIG. 8, a multi-stack package 200 of example embodiments may include a PCB 201, a first package 210, a second package 220, a display member 295 and a molding member 240.

The PCB 201 may supply power to the multi-stack package 200. Further, the PCB 201 may also input signals into the multi-stack package 200 and receive signals from the multi-stack package 200. Thus, the PCB 201 may be electrically connected to the first package 210 and the second package 220.

First pads 205 and second pads 207 may be arranged on an upper surface of the PCB 201. The first pads 205 and the second pads 207 may be electrically connected to a plurality of semiconductor chips 215 in the first package 210 and the second package 220. A plurality of lands 250 may be formed on a lower surface of the PCB 201. The multi-stack package 200 may be electrically coupled to external devices through the lands 250.

The first package 210 may include a first substrate 211, a first semiconductor chip 215 and first external terminals 217.

The first substrate 211 may have a rectangular shape, for example. First circuits (not shown) may be formed on the first substrate 211. The first circuits may input/output signals from/to the exterior. The first substrate 211 may include a PCB.

The first semiconductor chip 215 may be placed on an upper surface of the first substrate 211. The first semiconductor chip 215 may be electrically connected to the first circuits. The first semiconductor chip 215 may also be located on a lower surface of the first substrate 211.

The first semiconductor chip 215 may include a selection chip for selecting operable second semiconductor chips among second semiconductor chips 231, 232, 233 and 234 in the second package 220. Thus, if any of the second semiconductor chips 231, 232, 233 and 234 in the second package 220 is determined to be defective, the first semiconductor chip 215 may select only the operable second semiconductor chip or chips. As a result, the productivity of the multi-stack package 200 may be improved.

In example embodiments, the first semiconductor chip 215 may include at least one of a ball grid array (BGA) package, a land grid array (LGA) package, a thin small-outline package (TSOP), or a quad flat package (QFP).

A first protection member 219 may be formed on the upper surface of the first substrate 211 to cover the first semiconductor chip 215. In example embodiments, the first protection member 219 may include an epoxy resin. The first protection member 219 may secure the position of the first semiconductor chip 215 with respect to the first substrate 211, as well as protect the first semiconductor chip 215 from external shock.

The first external terminals 217 may be arranged on the lower surface of the first substrate 211. The first external terminals 217 may be electrically connected to the first pads 205 on the PCB 201. The first pads 205 may input/output signals from/to the exterior through the first external terminals 217. In example embodiments, the first external terminals 217 may include solder balls.

The second package 220 may be stacked on the first package 210. Thus, the first package 210 may correspond to a bottom package and the second package 220 may correspond to a top package.

The second package 220 may includes a second substrate 221, a plurality of second semiconductor chips 231, 232, 233 and 234 and second external terminals 247.

The second substrate 221 may have a rectangular shape, for example. Second circuits (not shown) may be formed on the second substrate 221. The second circuits may input/output signals from/to the exterior. The second substrate 221 may include a PCB.

The second semiconductor chips 231, 232, 233 and 234 may be placed on an upper surface of the second substrate 221. The second semiconductor chips 231, 232, 233 and 234 may be electrically connected to the second circuits. In example embodiments, the second semiconductor chips 231, 232, 233 and 234 may be electrically connected to the second circuits by a wire bonding process. That is, the second semiconductor chips 231, 232, 233 and 234 may be electrically connected to the second circuits through conductive wires 236, 237, 238 and 239.

In example embodiments shown in FIG. 8, the number of the second semiconductor chips 231, 232, 233 and 234 in the second package 220 is four. However, the number of the second semiconductor chips may not be restricted to four. Further, the second semiconductor chips 231, 232, 233 and 234 may be arranged on the upper surface or a lower surface of the second substrate 221.

Further, in example embodiments, the second semiconductor chips 231, 232, 233 and 234 may be mounted on the second substrate 221 by the wiring bonding process in FIG. 7. Alternatively, the second semiconductor chips 231, 232, 233 and 234 may be mounted on the second substrate 221 by a BGA process or a TSOP process.

A second protection member 235 may be formed on the upper surface of the second substrate 221 to cover the second semiconductor chips 231, 232, 233 and 234. In example embodiments, the second protection member 235 may secure positions of the second semiconductor chips 231, 232, 233 and 234 with respect to the second substrate 221, as well as protect the second semiconductor chips 231, 232, 233 and 234 from external shock.

In example embodiments, the second semiconductor chips 231, 232, 233 and 234 may have a shape different from that of the first semiconductor chip 215. However, the multi-stack package 200 of example embodiments may also have shapes other than those of the first semiconductor chips 215 and the second semiconductor chips 231, 232, 233 and 234.

The display member 295 displays operable second semiconductor chips among the second semiconductor chips 231, 232, 233 and 234. For example, the display member 295 may display positions of the defective second semiconductor chips, positions of the operable second semiconductor chips, the total memory capacity of the operable second semiconductor chips, etc. The display member 295 may include a first display portion 297 arranged on the lower surface 224 of the second substrate 221. Further, the display member 295 may also include a second display portion 299 arranged on an upper surface 222 of the second protection member 235.

The second external terminals 247 may be mounted on the lower surface of the second substrate 221. The second external terminals 247 may be electrically connected to the second circuits. The second circuits may input/output the signals from/to the second pads 207 through the second external terminals 247. In example embodiments, the second external terminals 247 may include solder balls, or the like.

The first package 210 and the second package 220 may be electrically coupled to each other. For example, the first external terminals 227 of the first package 210 may be electrically connected to the first pads 205. The second external terminals 247 of the second package 220 may be electrically connected to the second pads 207. That is, the first package 210 and the second package 220 may be electrically connected to each other by electrically connecting the first pads 205 and the second pads 207 with each other.

The first package 210 and the second package 220 may perform predetermined functions by reciprocally transmitting electrical signals with each other. To ensure the reciprocal functions of the first package 210 and the second package 220, it may be desirable to firmly combine physically and electrically the first package 210 and the second package 220 with each other.

The molding member 240 may be formed on the upper surface of the PCB 201 to cover the first package 210 and the second package 220. In example embodiments, the molding member 240 may include an EMC, or the like. The molding member 240 may secure the first package 210 and the second package 220 to the PCB 201, as well as protect the first package 210 and the second package 220 from external or electrical shock.

In example embodiments shown in FIG. 8, the multi-stack package 200 may include the two packages 210 and 220. However, the multi-stack package 200 may also include three or more packages.

According to example embodiments, when any of the second semiconductor chips is determined to be defective, the first semiconductor chip may select the operable second semiconductor chip or chips among the second semiconductor chips. Thus, the multi-stack package may be used regardless of the defective second semiconductor chip or chips. As a result, the productivity of the multi-stack package may be improved.

Figure 9A:
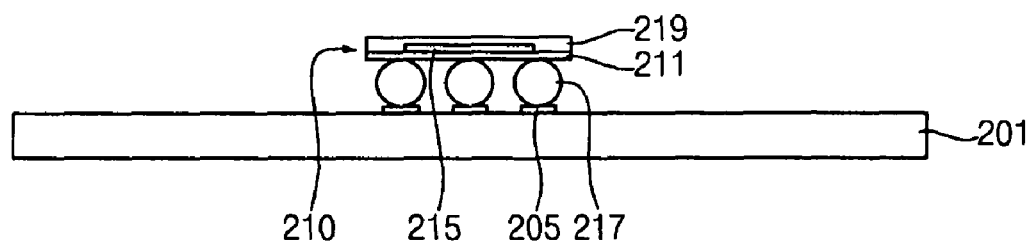
FIGS. 9A to 9C are cross-sectional views illustrating an example embodiment of a method of manufacturing the multi-stack package in FIG. 8.
Figure 9B:
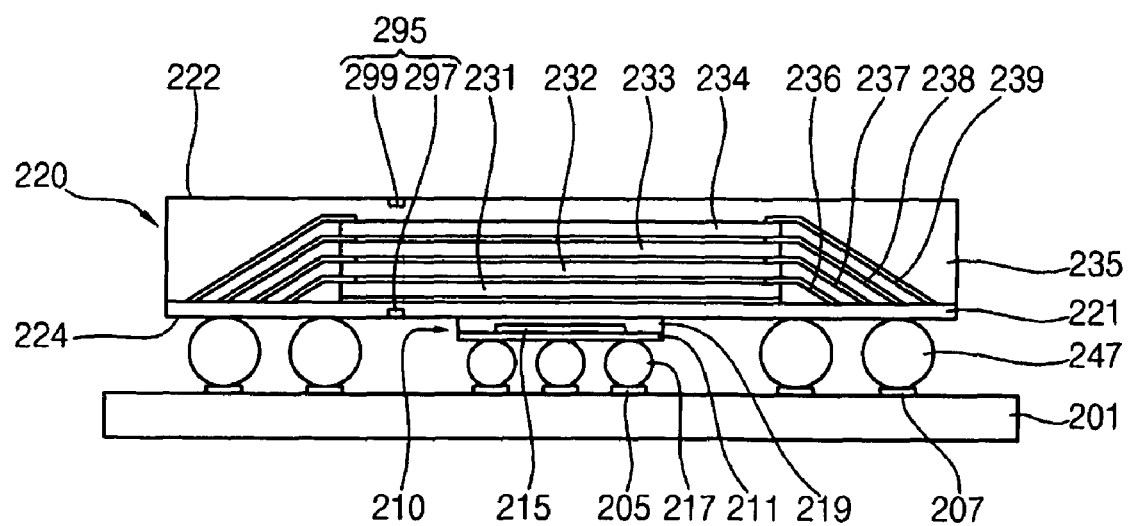
Figure 9C:
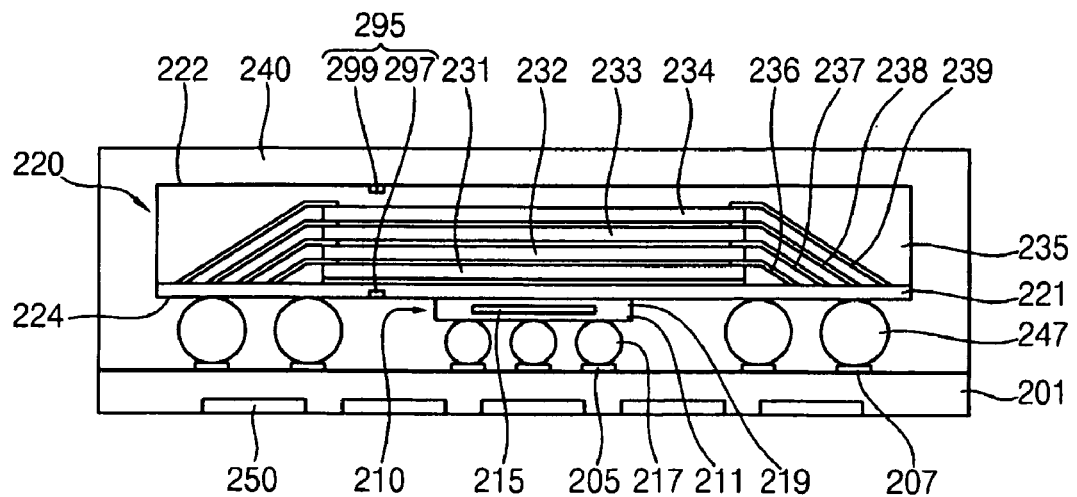

FIGS. 9A to 9C are cross-sectional views illustrating an example embodiment of a method of manufacturing the multi-stack package in FIG. 8.

The second semiconductor chips 231, 232, 233 and 234 may be tested using a tester (not shown) to determine whether the second semiconductor chips 231, 232, 233 and 234 are operable. Test results may then be displayed on the display member 295.

Referring to FIG. 9A, the first package 210 may be prepared by attaching the first semiconductor chip 215 to the upper surface of the first substrate 211, and mounting the first external terminals 217 on the lower surface of the first substrate 211. The first external terminals 217 may be electrically connected to the first semiconductor chip 215. Further, the first external terminals 217 may include a powdery solder paste formed by a silk screen process. The first package 210 may then be attached to the PCB 201 and the program corresponding to the test results displayed on the display member 295 may be inputted into the first semiconductor chip 215.

The first semiconductor chip 215 may correspond to the selection chip for selecting the operable second semiconductor chip(s) among the second lo semiconductor chips 231, 232, 233 and 234. Thus, even if one or more of the second semiconductor chips 231, 232, 233 and 234 may be defective, the first semiconductor chip 215 may select the operable second semiconductor chip or chips so that the productivity of the multi-stack package 200 may be improved.

Referring to FIG. 9B, the second package 220 may be prepared by attaching the second semiconductor chips 231, 232, 233 and 234 to the upper surface of the second substrate 221, and mounting the second external terminals 247 to the lower surface of the second substrate 221. The second external terminals 247 may be electrically connected to the second semiconductor chips 231, 232, 233 and 234.

The first package 210 and the second package 220 may be prepared simultaneously with each other. Further, the first package 210 and the second package 220 may have substantially the same shape.

The second package 220 may then be stacked on the first package 210 and the second external terminals 247 of the second package 220 may be attached to the PCB 201. The second external terminals 247 may be heated to reflow the second external terminals 247. When the second external terminals 247 are reflowed, the shapes of the second external terminals 247 may be changed.

Referring to FIG. 9C, the molding member 240 may be formed on the PCB 201 to cover the first package 210 and the second package 220, thereby completing the multi-stack package 200 in FIG. 8.

Figure 10:
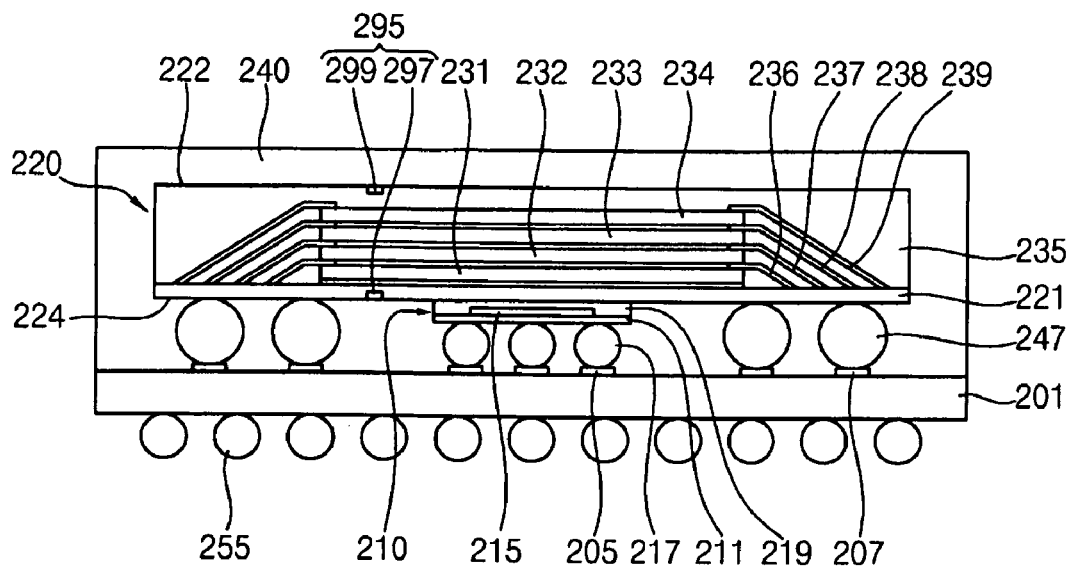
FIG. 10 is a cross-sectional view illustrating a multi-stack package in accordance with an example embodiment.

FIG. 10 is a cross-sectional view illustrating a multi-stack package in accordance with an example embodiment.

A multi-stack package 200a of example embodiments may include elements substantially the same as those of the multi-stack package 200 described above. Thus, the same reference numerals refer to the same elements and any further illustrations with respect to the same elements are omitted herein for brevity.

Referring to FIG. 10, the multi-stack package 200a of example embodiments may include the PCB 201, the first package 210, the second package 220 and the molding member 240.

The PCB 201 may supply power to the multi-stack package 200. Further, the PCB 201 may input signals into the multi-stack package 200 and receive signals from the multi-stack package 200. Thus, the PCB 201 may be electrically connected to the first package 210 and the second package 220.

The first pads 205 and the second pads 207 may be arranged on the PCB 201. The first pads 205 may be electrically connected to the first semiconductor chip 215 of the first package 210. The second pads 207 may be electrically connected to the second semiconductor chips 231, 232, 233 and 234 of the second package 220. Third external terminals 255 may be mounted to the lower surface of the PCB 201. The multi-stack package 200a may be electrically connected to external devices through the third external terminals 255.

The first package 210 may include the first substrate 211, the first semiconductor chip 215 and the first external terminals 217. The second package 220 may include the second substrate 221, the second semiconductor chips 231, 232, 233 and 234, and the second external terminals 247.

A method of manufacturing the multi-stack package 200a may be substantially the same as that described above. Thus, any further illustrations with respect to the method are omitted herein for brevity.

Figure 11:
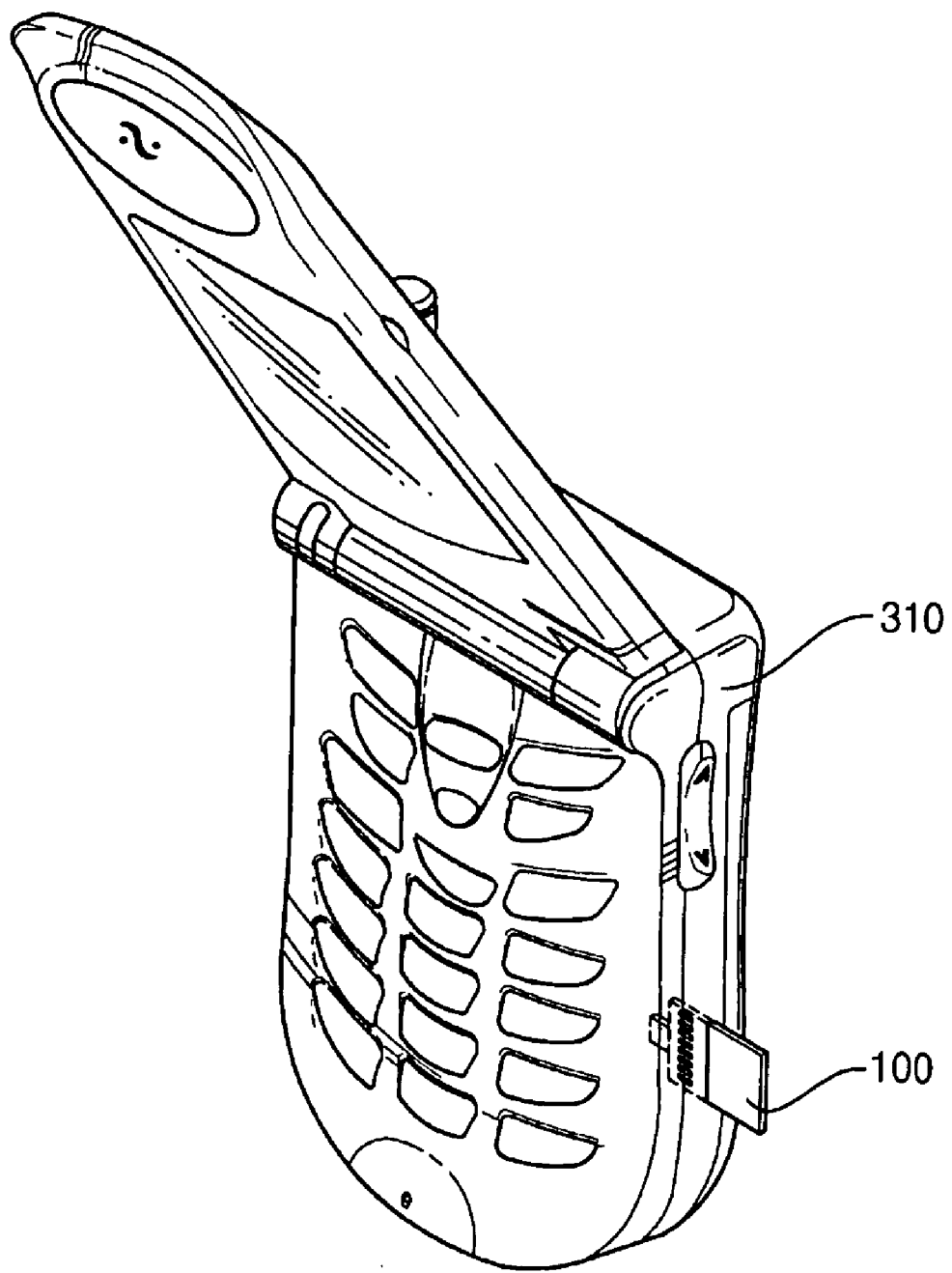
FIGS. 11 and 12 are perspective views illustrating digital devices in accordance with an example embodiment.
Figure 12:
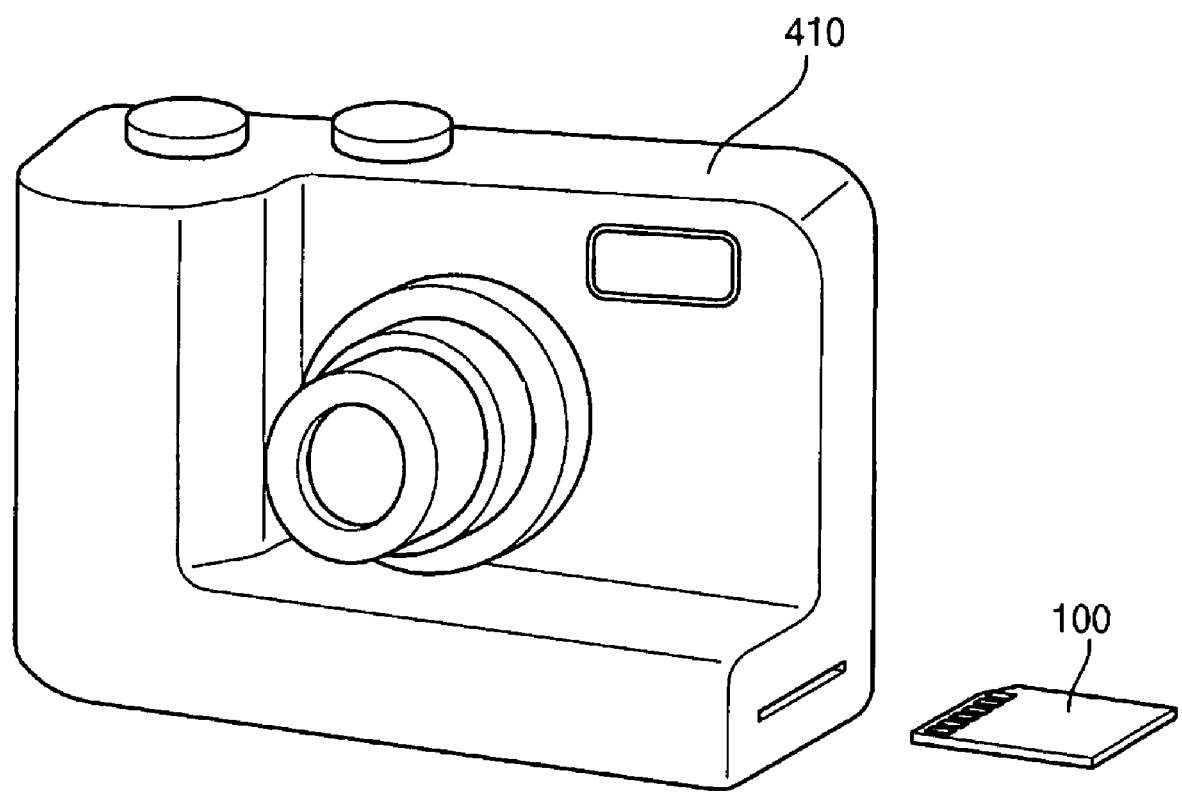

FIGS. 11 and 12 are perspective view illustrating digital devices in accordance with an example embodiment.

Referring to FIG. 11, a cellular phone 300 is depicted as an example embodiment of a digital device. The cellular phone 300 may include a body 310 and the chip stack package 100 built into the body 310. The chip stack package 100 is illustrated in detail in FIG. 1. Thus, any further illustrations with respect to the chip stack package 100 are omitted herein for brevity. Further, the cellular phone 300 may include any one of the chip stack packages 100a, 100b and 100c, shown in FIGS. 3, 5 and 7, respectively, or the multi-stack packages 200 and 200a, shown in FIGS. 8 and 10, respectively, in place of the multi-stack package 100.

Referring to FIG. 12, a digital camera 400 is depicted as an example embodiment of a digital device. The digital camera 400 may include a body 410 and the chip stack package 100 built into the body 410. The chip stack package 100 is illustrated in detail in FIG. 1. Thus, any further illustrations with respect to the chip stack package 100 are omitted herein for brevity. Further, the digital camera 400 may include any one of the chip stack packages 100a, 100b and 100c, shown in FIGS. 3, 5 and 7, respectively, or the multi-stack packages 200 and 200a, shown in FIGS. 8 and 10, in place of the multi-stack package 100.

In example embodiments, the cellular phone and the digital camera are provided as examples of the digital devices. However, the stack package may also be applied to other digital devices, such as a digital camcorder, for example.

According to at least some example embodiments, operable semiconductor chips may be selected from among defective semiconductor chip. Thus, even if a stack package includes defective semiconductor chip(s), the stack package may be used and not discarded. As a result, the productivity of the stack package may be improved.

The foregoing example embodiments are not to be construed as limiting thereof. Although example embodiments have been described, those skilled in the art will readily appreciate that many modifications are possible in example embodiments without materially departing from the novel teachings and advantages thereof. Accordingly, all such modifications are intended to be included within the scope of example embodiments as defined in the claims.

What is claimed is:

1. A chip stack package comprising:
a first package including
a substrate having a wiring pattern,
a plurality of semiconductor chips stacked on a first surface of the substrate, the semiconductor chips being electrically connected to the wiring pattern, and
a first molding member on the first surface of the substrate to cover the semiconductor chips;
a controller arranged on a second surface of the substrate and electrically connected to the wiring pattern, the controller selecting operable semiconductor chips among the plurality of semiconductor chips; and
a display member on at least one of the second surface of the substrate and a first surface of the first molding member, the display member displaying information relating to the operable semiconductor chips.

2. The chip stack package of claim 1, wherein the plurality of semiconductor chips and the wiring pattern are electrically connected to each other through conductive wires or plugs.

3. The chip stack package of claim 1, wherein the controller and the wiring pattern are electrically connected to each other through conductive bumps.

4. The chip stack package of claim 1, wherein the controller includes a selection chip selecting the operable semiconductor chips among the plurality of semiconductor chips, and the selection chip is attachable to the controller via a receiving groove in the controller.

5. The chip stack package of claim 4, wherein the receiving groove is on a third surface of the controller.

6. The chip stack package of claim 4, wherein the selection chip comprises read-only memory (ROM) or static random access memory (SRAM).

7. The chip stack package of claim 1, wherein the controller includes a logic chip for controlling the operation of the semiconductor chips.

8. The chip stack package of claim 1, wherein the first package further includes external terminals on the second surface of the substrate.

9. A chip stack package, comprising:
a first package including
a substrate having a wiring pattern,
a plurality of semiconductor chips stacked on a first surface of the substrate, the semiconductor chips being electrically connected to the wiring pattern, and
a first molding member on the first surface of the substrate to cover the semiconductor chips;
a logic chip on the second surface of the substrate and electrically connected to the wiring pattern to control the operation of the semiconductor chips;
a selection chip on the second surface of the substrate and electrically connected to the wiring pattern to select operable semiconductor chips among the semiconductor chips; and
a display member on at least one of the second surface of the substrate and a first surface of the first molding member, the display member displaying information relating to the operable semiconductor chips.

10. The chip stack package of claim 1, wherein each of the second surface of the substrate and the first surface of the first molding member include a display member displaying information relating to the operable semiconductor chips.

11. A multi-stack package comprising:
a printed circuit board (PCB); and
a chip stack package, the chip stack package including
a first package including
a substrate having a wiring pattern,
a plurality of semiconductor chips stacked on a first surface of the substrate, the semiconductor chips being electrically connected to the wiring pattern, and
a first molding member on the first surface of the substrate to cover the semiconductor chips;
a controller arranged on a second surface of the substrate and electrically connected to the wiring pattern, the controller selecting operable semiconductor chips among the plurality of semiconductor chips, wherein the controller is part of a second package; and
a display member on at least one of the second surface of the substrate and a first surface of the first molding member, the display member displaying information relating to the operable semiconductor chips; and
a second molding member on the PCB to cover the first package and the second package.

12. The chip stack package of claim 11, wherein each of the second surface of the substrate and the first surface of the first molding member include a display member displaying information relating to the operable semiconductor chips.

13. The multi-stack package of claim 11, wherein the second package comprises a ball grid array (BGA) package, a land grid array (LGA) package, a thin small-outline package (TSOP) or a quad flat package (QFP).

14. The multi-stack package of claim 11, wherein the first package comprises a BGA package or a TSOP.

15. A digital device comprising:
a body; and
a chip stack package built into the body, the chip stack comprising
a first package including
a substrate having a wiring pattern,
a plurality of semiconductor chips stacked on a first surface of the substrate, the semiconductor chips being electrically connected to the wiring pattern, and
a first molding member on the first surface of the substrate to cover the semiconductor chips;
a controller arranged on a second surface of the substrate and electrically connected to the wiring pattern, the controller selecting operable semiconductor chips among the plurality of semiconductor chips; and
a display member on at least one of the second surface of the substrate and a first surface of the first molding member, the display member displaying information relating to the operable semiconductor chips.

16. A method of manufacturing a chip stack package, comprising:

stacking a plurality of semiconductor chips on a first surface of a substrate having a wiring pattern, the semiconductor chips being electrically connected to the wiring pattern;

forming a molding member on the first surface of the substrate to cover the semiconductor chips;

testing the semiconductor chips to determine whether the semiconductor chips are operable or not;

electrically connecting a controller to the wiring pattern, on a second surface of the substrate, the controller including a logic chip for controlling the operation of the semiconductor chips and a selection chip for selecting operable semiconductor chips among the plurality of semiconductor chips; and forming a display member on at least one of the second surface of the substrate and a first surface of the first molding member, the display member displaying information relating to the operable semiconductor chips.

17. The method of claim 16, wherein arranging the controller comprises:

integrally providing the logic chip and the selection chip to the controller, the selection chip having a program for selecting the operable semiconductor chips.

18. The method of claim 16, wherein electrically connecting the controller comprises:

forming a receiving groove for detachably receiving the selection chip in the controller; and inserting the selection chip into the receiving groove to connect the selection chip with the wiring pattern, the selection chip having a program for selecting the operable semiconductor chips.

19. The method of claim 16, wherein the plurality of semiconductor chips and the wiring pattern are electrically connected to each other through conductive wires or plugs.

20. The method of claim 16, wherein the controller and the wiring pattern are electrically connected to each other through conductive bumps.

21. The method of claim 16, further comprising mounting external terminals on the second surface of the substrate.

* * * * *